United States Patent [19]
Zhu et al.

[11] Patent Number: 5,849,413
[45] Date of Patent: Dec. 15, 1998

[54] ORIENTED DIAMOND FILM STRUCTURES ON NONDIAMOND SUBSTRATES

[75] Inventors: Wei Zhu; Peichun Yang, both of Raleigh; Jeffrey T. Glass, Apex, all of N.C.

[73] Assignee: North Carolina State University, Raleigh, N.C.

[21] Appl. No.: 474,398

[22] Filed: Jun. 6, 1995

Related U.S. Application Data

[62] Division of Ser. No. 282,167, Jul. 28, 1994, Pat. No. 5,449,531, which is a continuation of Ser. No. 062,473, May 17, 1993, which is a continuation-in-part of Ser. No. 973,633, Nov. 9, 1992, Pat. No. 5,298,286.

[51] Int. Cl.$^6$ .................................................. C30B 25/02
[52] U.S. Cl. ........................... 428/408; 257/77; 428/212; 428/469; 428/698
[58] Field of Search .................................. 428/212, 469, 428/408, 698; 257/77

[56] References Cited

U.S. PATENT DOCUMENTS

| | | | |
|---|---|---|---|
| 4,062,660 | 12/1977 | Nicholas et al. | 51/295 |
| 4,849,199 | 7/1989 | Pinneo | 423/446 |
| 5,006,203 | 4/1991 | Purdes et al. | 427/249 |
| 5,075,094 | 12/1991 | Morrish et al. | 423/446 |
| 5,082,359 | 1/1992 | Kirkpatrick | 359/642 |
| 5,082,522 | 1/1992 | Purdes et al. | 156/612 |
| 5,108,779 | 4/1992 | Gasworth | 427/249 |
| 5,298,286 | 3/1994 | Yang et al. | 427/249 |
| 5,298,296 | 3/1994 | Yang et al. | 427/249 |
| 5,455,072 | 10/1995 | Bension et al. | 427/249 |

FOREIGN PATENT DOCUMENTS

| | | |
|---|---|---|
| 0530021 A2 | 3/1993 | European Pat. Off. . |
| JP4132687 | 8/1992 | Japan . |
| 89/11897 | 12/1989 | WIPO . |
| WO93/05207 | 3/1993 | WIPO . |

OTHER PUBLICATIONS

Belton et al., Nucleation of Chemically Vapor Deposited Diamond on Platinum and nickel Substrates, *Thin Solid Films*, May 15, 1992, pp.68–80.

Narayan et al., Enhancement of Nucleation and Adhesion of Diamond Films on Copper, Stainless Steel, and Silicon Substrates, *Journal of Applied Physics*, vol. 71, No. 2, Jan. 15, 1992.

Bovenkerk et al., Preparation of Diamond, *Nature*, pp. 1094–1098, Oct. 10, 1959.

Sato et al., Epitaxial Growth of Diamond from the Gas Phase, *New Diamond Science and Technology*, 1987 MRS Int. Conf. Proc., pp. 371–376.

(List continued on next page.)

*Primary Examiner*—Archene Turner
*Attorney, Agent, or Firm*—Myers, Bigel, Sibley & Sajovec, L.L.P.

[57] ABSTRACT

A method for making an oriented diamond film includes the steps of saturating a surface region of a transition metal substrate, capable of dissolving carbon, with carbon and hydrogen; forming oriented diamond nuclei on the saturated surface region of the substrate; and growing diamond on the oriented diamond nuclei to form the oriented diamond film. It is theorized that the saturation forms transition metal-carbon-hydrogen surface states (Metal$_x$—C$_y$—H$_z$, where x+y+z=1) on the transition metal substrate while suppressing formation of graphite. Diamond may then be deposited onto the oriented diamond nuclei by CVD techniques to thereby form an oriented diamond film on the nondiamond substrate. The nondiamond substrate is preferably a single crystal transition metal capable of dissolving carbon. The transition metal is preferably selected from the group consisting of nickel, cobalt, chromium, magnesium, iron, and alloys thereof. Structures produced by the method are also disclosed and include an oriented diamond film on a nondiamond transition metal substrate.

10 Claims, 11 Drawing Sheets

OTHER PUBLICATIONS

R. H. Wentorf, Jr., Diamond Synthesis, General Electric Research Laboratory, Schenectady, New York.

E. Hartmann, On the Orientation Effects of Capillary Forces, *Acta Physica Academiae Scientiarum Hungaricae*, Tomus 47 (1–3), pp.185–188 (1979).

E. Hartmann, Symmetrical Configurations by Capillary Forces, *Acta Physica Academiae Scientiarum Hungaricae*, Tomus 47 (1–3), pp. 189–190 (1979).

V. I. Klykov et al., Diataxial Growth of Silicon and Germanium, *Journal of Crystal Growth*, 52 (1981) pp. 687–691.

D. S. Olson et al., Growth of Diamond From Sputtered Atomic Carbon and Atomic Hydrogen, *Mat. Res. Soc. Symp. Proc.*, vol. 270.

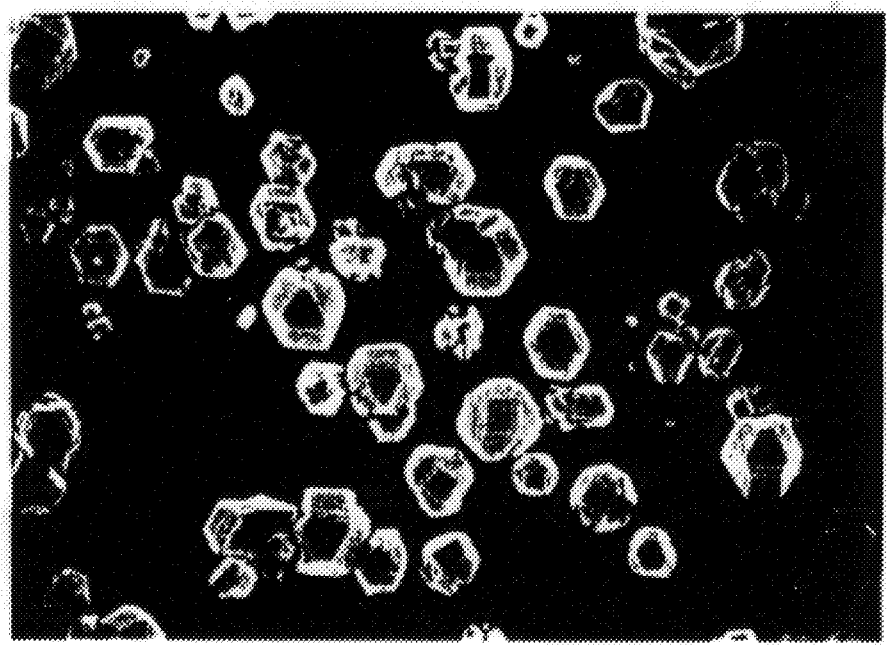
FIG. 7A.      5 μm
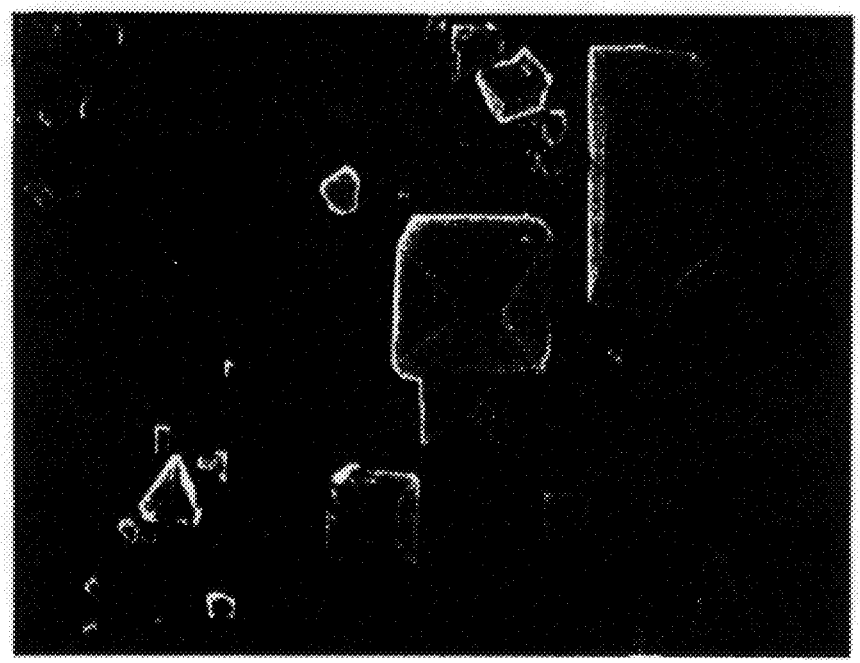
FIG. 7B.      5 μm

10 μm

ORIENTED DIAMOND FILM STRUCTURES ON NONDIAMOND SUBSTRATES

RELATED APPLICATION

This application is a divisional of prior file wrapper continuation application Ser. No. 08/282,167, filed Jul. 28, 1994, now U.S. Pat. No. 5,449,531, which is a continuation of Ser. No. 08/062,473 filed May 17, 1993 the disclosure of which is incorporated by reference herein in its entirety, which is a continuation-in-part application of U.S. patent application Ser. No. 07/973,633 filed on Nov. 9, 1992 now U.S. Pat. No. 5,298,286.

FIELD OF THE INVENTION

This invention relates to the field of materials, and, more particularly, to a method for fabricating diamond films on nondiamond substrates, such as for microelectronic applications, and the structures produced according to the method.

BACKGROUND OF THE INVENTION

Diamond is a preferred material for semiconductor devices because it has semiconductor properties that are superior to conventional semiconductor materials, such as silicon, germanium or gallium arsenide. Diamond provides a higher energy bandgap, a higher breakdown voltage, and a higher saturation velocity than these traditional semiconductor materials.

These properties of diamond yield a substantial increase in projected cutoff frequency and maximum operating voltage compared to devices fabricated using more conventional semiconductor materials. For example, silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, that is, diamond is a "radiation-hard" material.

Because of the advantages of diamond as a material for semiconductor devices, there is at present an interest in the growth and use of diamond for high temperature and radiation-hardened electronic devices. In particular, there is a present interest in the growth and use of single crystal diamond as a material for semiconductor devices. This interest is due in part to the increased efficiency of operation of single crystal semiconducting diamond in comparison with polycrystalline semiconducting diamond in which grain boundaries may impede the flow of charge carriers within the device.

Unfortunately, the fabrication of a single crystal diamond film is typically carried out by homoepitaxial deposition of a semiconducting diamond film on a single crystal diamond substrate. Such a single crystal diamond substrate is relatively expensive. Thus, the heteroepitaxial growth of single crystal diamond thin films on nondiamond substrates by chemical vapor deposition (CVD) has long been sought due to its enormous potential impact on the microelectronics industry.

Promising candidate substrate materials for the heteroepitaxial growth of diamond include cBN, β-SiC, BeO, Ni, Cu, Si, and a few refractory metals such as Ta, W and Mo. Nickel is one of the few materials that has a relatively close lattice match with diamond (a=3.52 Å for Ni and a=3.56 Å for diamond). However, apart from reports of heteroepitaxial growth of diamond films on cBN and β-SiC substrates and some limited success of growing some diamond particles oriented on nickel substrates, most experiments have yielded randomly oriented, three-dimensional diamond nuclei which are not suitable for forming a single crystal diamond film as is desirable for semiconductor applications. It is believed that the extremely high surface energy of diamond (in the range of 5.3–9.2 J/m$^2$ for the principal low index planes) and the existence of extensive interfacial misfit and strain energies between diamond films and nondiamond substrates may be the primary obstacles in forming oriented two-dimensional diamond nuclei.

It has been known for decades that nickel is an effective catalyst metal for diamond crystallization under high pressure and high temperature (HPHT) conditions. See, for example, Preparation of Diamond by Bovenkerk et al., Nature, pp. 1094–1098, Oct. 10, 1959. Although a detailed mechanism of the catalytic effect has not been completely developed, it is believed that its strong reactivity with carbon is essential in the catalytic HPHT diamond growth process. However, nickel's high solubility for carbon and its strong catalytic effect on hydrocarbon decomposition and subsequent graphite formation at low pressures have prevented CVD diamond nucleation on its surface without the deposition of an intermediate graphite layer.

A graphite interlayer generally forms immediately when nickel substrates are placed in a methane-hydrogen CVD environment. This has precluded the possible development of an oriented relationship between the diamond film and the nickel substrate, even though diamond might eventually nucleate and grow on the graphite interlayer. The graphite interlayer also prevents good mechanical adhesion to the underlying substrate.

Sato et al. in an article entitled *Epitaxial Growth of Diamond from the Gas Phase*, New Diamond Science and Technology, 1987 MRS Int. Conf. Proc., pp. 371–376, discloses some epitaxial diamond growth on a nickel substrate starting with a mechanical surface preparation using a diamond powder to abrade the nickel substrate surface to increase nucleation density. Nucleation density was reported to be highest for a CVD temperature in the range of 800°–900° C. during diamond deposition, although deposition was carried out in the temperature range of 500°–1000° C. Sato et al. disclose that the methane concentration must be kept below a critical value at a given substrate temperature in an attempt to suppress graphite formation.

SUMMARY OF THE INVENTION

In view of the foregoing background, it is, therefore, an object of the present invention to provide a method for forming an oriented diamond film on a nondiamond substrate, particularly to enable the growth of a single crystal diamond film on the nondiamond substrate.

It is another object of the present invention to provide a method for forming a diamond film on a nondiamond substrate using CVD techniques while avoiding the formation of graphite so as to permit formation of an oriented diamond film and/or to produce strong mechanical adhesion between the nondiamond substrate and the thus formed diamond film.

These and other objects, advantages and features of the present invention are provided by a method including the steps of saturating a surface region of a transition metal substrate, capable of dissolving carbon, with carbon and hydrogen; forming oriented diamond nuclei on the saturated surface region of the substrate; and growing diamond on the oriented diamond nuclei to form the oriented diamond film. The substrate transition metal is preferably selected from the group consisting of nickel, cobalt, chromium, magnesium, iron, and alloys thereof, and more preferably, is selected from the group consisting of nickel, cobalt, and alloys thereof which have a relatively close lattice match to diamond. Applicants theorize without wishing to be bound thereto that the saturation forms transition metal-carbon-hydrogen surface states (Metal$_x$—C$_y$—H$_z$, where x+y+z=1) on the transition metal substrate while suppressing formation of graphite.

By oriented diamond film is meant that the individual diamond nuclei are substantially in alignment with the lattice of corresponding portions of the nondiamond substrate. If the nondiamond substrate is a polycrystalline substrate, the oriented diamond film will also be polycrystalline. Moreover, if the nondiamond substrate is single crystal, and especially if the nondiamond substrate material has a relatively close lattice match with diamond, the oriented diamond film may be further grown into a single crystal diamond film. As would be readily understood by those skilled in the art, with proper growing conditions, individual oriented diamond nuclei can be grown together so that grain boundaries effectively disappear.

In one embodiment of the invention, the saturation of the transition metal surface region may be performed directly from gaseous specie including carbon and hydrogen. In other words, the step of saturating the surface region of the substrate with carbon and hydrogen preferably includes heating the substrate at a predetermined temperature of about 900° to 1300° C., and more preferably about 1100° C. and for a predetermined time of about 0.5 minutes to 10 hours, and, more preferably, about 0.5 hours to 4 hours in a hydrogen and carbon-containing gas atmosphere. More particularly, the hydrogen and carbon-containing gas preferably includes methane and hydrogen. The methane is preferably in the range of about 1% to 100% by mass of the gas, and, more preferably about 5% to 20% by mass. As would be readily understood by those skilled in the art, other hydrogen and carbon-containing gasses may also be used to saturate the surface region of the transition metal substrate.

In another embodiment of the invention the saturated surface region of the substrate is preferably provided by forming a carbon-containing layer on the substrate, and heating the substrate and carbon-containing layer at a predetermined temperature in the range of about 900° to 1300° C., and more preferably, about 1100° C. in a hydrogen gas atmosphere. The carbon containing layer may be provided by depositing a layer of diamond powder onto the substrate as disclosed in the parent application, Ser. No. 07/973,633, filed on Nov. 9, 1992, the entire disclosure of which is incorporated herein by reference. Alternately, and according to another significant aspect of the present invention, the carbon-containing layer may be provided by depositing a nondiamond carbon-containing powder onto the substrate.

The nondiamond carbon-containing powder may include one or more of graphite; fullerenes, such as $C_{60}$ or $C_{70}$; soot; carbon black; sugar charcoal; and the like, onto the substrate. Those skilled in the art may readily appreciate other nondiamond carbon-containing powders contemplated by the present invention. As would also be readily appreciated by those skilled in the art, the carbon-containing layer may also be provided by an in-situ formed layer on the surface of the substrate. The in-situ deposited layer may include graphite, glassy carbon, soot and diamond-like carbon (DLC). To form graphite, for example, the substrate may be exposed to a 0.5% methane in hydrogen gas at a temperature of about 500° C. To form DLC, the substrate may be exposed to a 5% methane in hydrogen gas at a temperature of about 900° C.

The substrate and carbon-containing layer are preferably heated to a predetermined temperature in the range of about 900° to 1200° C. An aspect of the present invention is that observing the appearance of the carbon-containing layer during heating serves to indicate when the surface is saturated and, thus, when the temperature can be reduced for nucleation and diamond growth. For example, when the carbon-containing layer has been heated for a sufficient time, the layer changes to a shiny or reflective appearance. For example, the heating time may be about 0.5 hour for a diamond powder, about 5 minutes for a graphite powder, and about 15 minutes for fullerenes, each heating time period also depending upon the thickness of the layer.

The transition metal substrate may be either single crystal or polycrystalline. For a single crystal nondiamond substrate, the diamond is preferably formed on a low index plane oriented face selected from the group consisting of {100}, {110}, {111}, {120}, {112}, {114}, and {221}.

The method of the present invention is desirably used to produce a microelectronic structure including an oriented diamond film. The oriented diamond film may be used for forming diamond-based semiconductor devices, such as for high temperature or radiation-hardened applications. Alternately, an additional layer of single crystal semiconducting diamond may be readily deposited onto the oriented diamond film for fabricating diamond semiconductor devices thereon.

The microelectronic structure includes a transition metal substrate capable of dissolving carbon, a surface region on the transition metal substrate including transition metal-carbon-hydrogen states, and the oriented diamond film on the surface region. In other words, the substrate has a surface region saturated with carbon and hydrogen. As discussed above, the transition metal is preferably selected from the group consisting of nickel, cobalt, chromium, magnesium, iron, and alloys thereof, and more preferably is a single crystal material, selected from the group consisting of nickel, cobalt, and alloys thereof which have a relatively close lattice match to diamond. For a single crystal substrate, the oriented diamond film is preferably formed on a low index plane oriented face selected from the group consisting of {100}, {110}, {111}, {120}, {112}, {114}, and {221}.

BRIEF DESCRIPTION OF THE DRAWINGS

FIGS. 7A–7C are SEM micrographs of diamond films grown on a single crystal Ni surface using $C_{60}$, graphite, and gaseous carbon, respectively, as described in Example 1.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout and the sizes of regions and layers are exaggerated for clarity.

Figure 1:
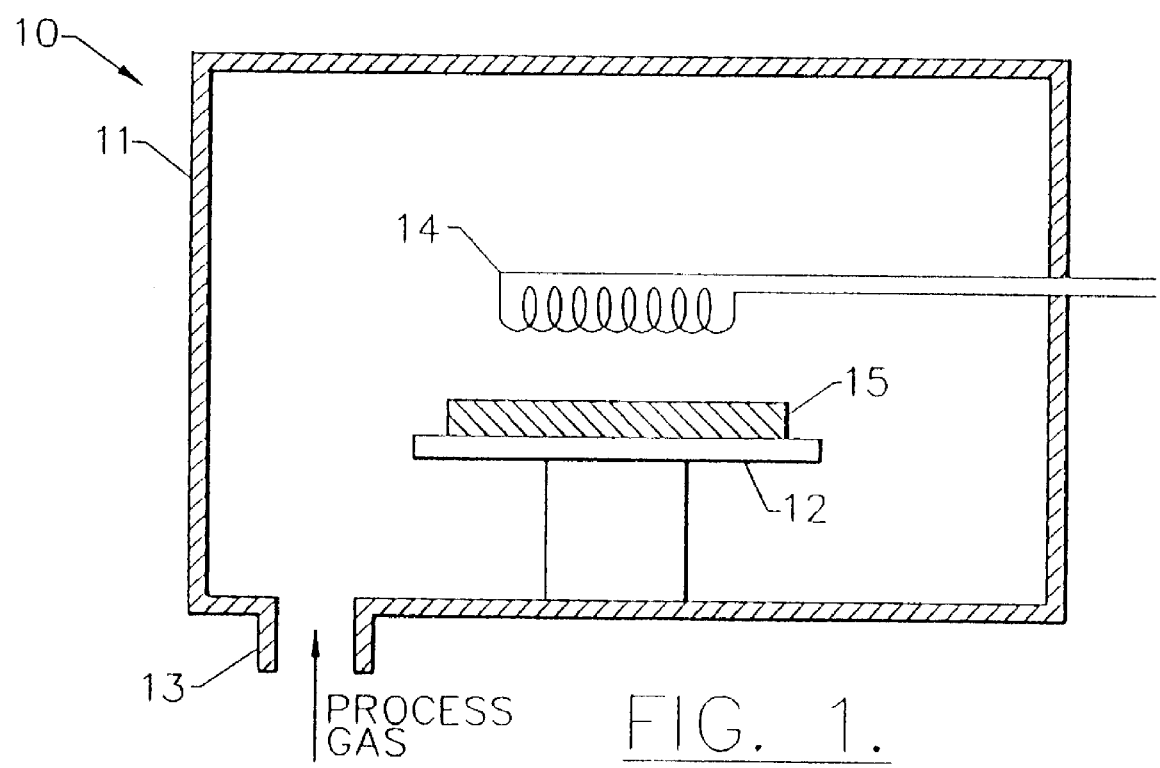
FIG. 1 is a schematic diagram of a conventional CVD reactor as used for carrying out the method according to the invention.

Referring now to FIG. 1, a conventional CVD reactor 10 for performing the multi-step deposition process according to the invention is schematically illustrated. The reactor 10 includes an evacuable chamber 11, a substrate holder 12, a substrate 15, one or more gas ports 13, and one or more tungsten filament heaters 14, as would be readily understood by those skilled in the art. The reactor 11 may also include associated substrate temperature sensing means, not shown, such as a thermocouple or optical pyrometer as would be readily understood by those skilled in the art. As would also be readily understood by those skilled in the art, the method according to the present invention may be readily carried out using other conventional semiconductor tools, such as an ECR or plasma enhanced CVD processing chamber.

The nondiamond substrate 15 preferably includes a transition metal selected from the group consisting of nickel, cobalt, chromium, magnesium, iron, and alloys thereof. More preferably, the substrate may be single crystal and include a transition metal may be selected from the group consisting of nickel, cobalt and alloys thereof which have a relatively close lattice match to diamond. These transition metals are capable of dissolving carbon and are highly reactive with carbon.

The method includes the steps of saturating a surface region of a transition metal substrate 15 with carbon and hydrogen; forming oriented diamond nuclei on the saturated surface region of the substrate; and growing diamond on the oriented diamond nuclei to form the oriented diamond film.

Applicants theorize without wishing to be bound thereto that the saturation forms transition metal-carbon-hydrogen surface states ($Metal_x$—$C_y$—$H_z$, where $x+y+z=1$) on the transition metal substrate while suppressing formation of graphite.

In one embodiment of the invention the saturation of the transition metal surface region may be performed directly from gaseous specie including carbon and hydrogen. In other words, the step of saturating the surface region of the substrate 15 with carbon and hydrogen preferably includes heating the substrate 15 at a predetermined temperature and for a predetermined time in a hydrogen and carbon-containing gas atmosphere. More particularly, the hydrogen and carbon-containing gas preferably includes pure methane or methane and hydrogen. The methane concentration may be in the range of about 1% and 100% by mass, and more preferably, about 2% to 5% by mass in hydrogen. As would be readily understood by those skilled in the art, other gasses may also be used to saturate the surface region of the transition metal substrate.

In another embodiment of the invention the saturated surface region of the substrate 15 is preferably provided by forming a carbon-containing layer on the substrate, and heating the substrate and carbon-containing layer at a predetermined temperature and for a predetermined time in a hydrogen gas atmosphere. The carbon containing layer may be provided by depositing a layer of diamond powder onto the substrate as disclosed in the parent application, Ser. No. 07/973,633, filed on Nov. 9, 1992. Alternately, and according to another significant aspect of the present invention, the carbon-containing layer may be provided by depositing a nondiamond carbon-containing powder onto the substrate.

The nondiamond carbon-containing powder may include one or more of graphite, a fullerene such as $C_{60}$ or $C_{70}$, soot, carbon black, sugar charcoal, and the like, onto the substrate. Those skilled in the art may readily appreciate other nondiamond carbon-containing powders contemplated by the present invention. As would also be readily appreciated by those skilled in the art, the carbon-containing layer may also be provided by an in-situ formed layer of graphite, glassy carbon, soot or diamond-like carbon (DLC) on the substrate. To form graphite, for example, the substrate may be exposed to a 0.5% methane in hydrogen gas at a temperature of about 500° C. To form DLC, the substrate may be exposed to a 5% methane in hydrogen gas at a temperature of about 900° C.

The substrate and carbon-containing layer are preferably heated or annealed at a predetermined temperature in the range of about 900° to 1300° C., and more preferably about 1100° C., particularly where Ni is the substrate material. The time for heating the substrate is preferably determined by observing the appearance of the carbon-containing layer during heating. For example, when the layer has been heated for a sufficient time, the layer changes to a shiny or reflective appearance and heating may be stopped or the temperature lowered for diamond nucleation and growth.

The transition metal substrate 15 may be either single crystal or polycrystalline. For a single crystal nondiamond substrate, the diamond is preferably formed on a low index plane oriented face selected from the group consisting of {100}, {110}, {111}, {120}, {112}, {114}, and {221}.

As would be readily understood by those skilled in the art, the step of depositing the diamond onto the oriented diamond nuclei preferably includes chemical vapor deposition using a carbon and hydrogen containing gas mixture, such as a methane and hydrogen gas mixture, while the substrate is maintained at a predetermined temperature in the range of about 700° to 1000° C., and more preferably in the range of about 900° to 950°. The methane and hydrogen gas mixture, for example, preferably includes a methane concentration in the range of about 0.1 to 1.5% by mass, and more preferably no more than about 0.5% methane by mass. As would be readily understood by those skilled in the art, other gas mixtures for CVD formation of diamond may be readily used. In addition, the CVD deposition of diamond may be carried out at conventional CVD pressures, such as in the range of about 10 to 150 Torr.

In the following portions of the description, several models are proposed, wherein Ni is used as the exemplary transition metal. Applicants propose these models to fully disclose the invention without wishing to be bound to the models.

Figure 2A:
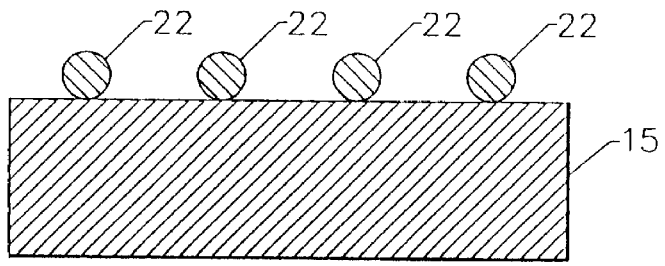
FIG. 2A–2E are schematic cross-sectional views illustrating the method according to the present invention according to a first nucleation model.
Figure 2B:
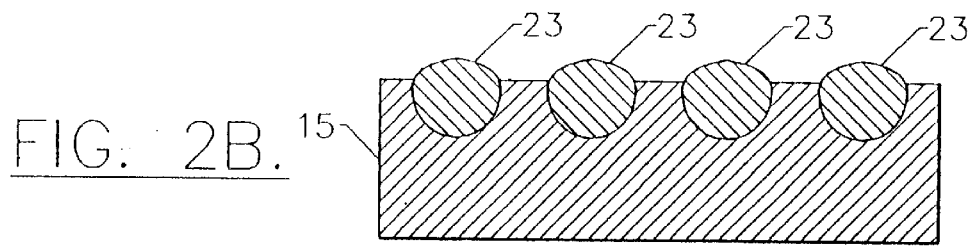

Once the desired Ni—C—H surface states are formed, the epitaxial orientation of diamond is believed to develop via one of the following several mechanisms or models. Referring to FIGS. 2A–2E, a first nucleation model is explained wherein a carbon-containing powder 22 is deposited onto the substrate 15 (FIG. 2A). As shown in FIG. 2B, upon heating or annealing to about 1100° C., the carbon seeds 22 dissolve into the surface of the substrate 15 forming molten areas or Ni—C—H surface states 23. As would be readily understood by those skilled in the art, for heavy seeding, the Ni—C—H may extend across the entire substrate in a layer rather than in discrete areas as shown in the illustrated embodiment.

Figure 2C:
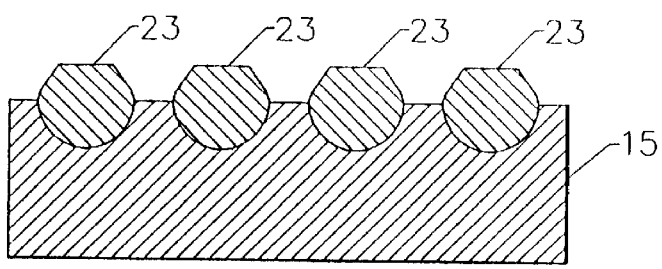
Figure 2D:
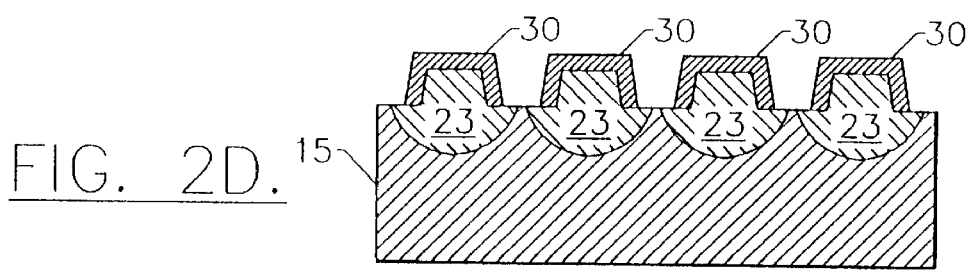
Figure 2E:
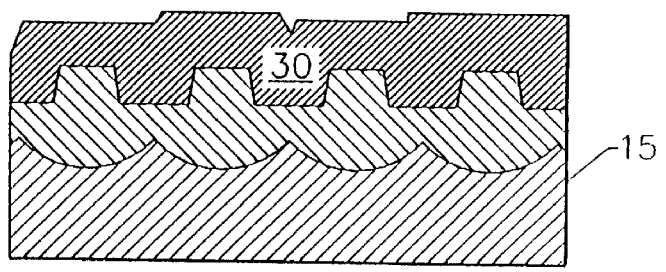
Figure 3A:
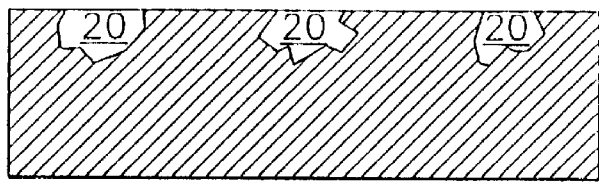
FIGS. 3A–3D are schematic cross-sectional views illustrating the method according to the present invention according to a second nucleation model.
Figure 3B:
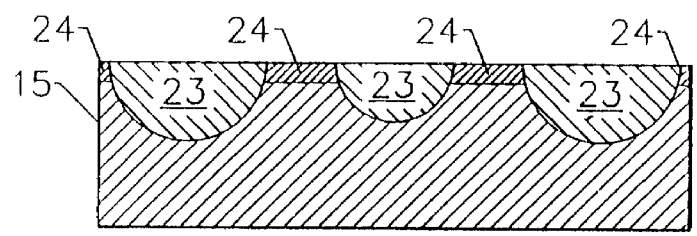
Figure 3C:
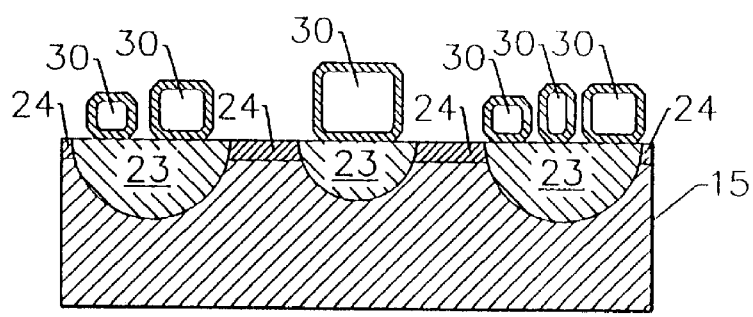
Figure 3D:
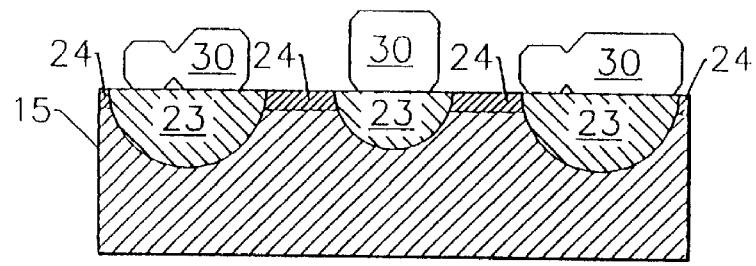

FIG. 2C shows solidified Ni—C—H intermediate surface states at a relatively lower temperature, for example, about 950° C. In this nucleation model, as shown in FIG. 2D, it is believed that diamond 30 nucleates on the solidified intermediate surface states 23 and can be grown out wherein the diamond nuclei grow together thereby eliminating grain boundaries to form the oriented diamond film as shown in FIG. 2E.

Another similar mechanism or model is illustrated in FIGS. 3A–3E. This mechanism is a second nucleation process in which diamond nucleates on a Ni substrate 15 saturated with both carbon and hydrogen. It is believed that the diamond seeds 20 (FIG. 3A) are completely dissolved into the Ni lattice (FIG. 3B), but the carbon remains highly concentrated in the regions 23 where the diamond seeds are originally located, and is less highly concentrated in adjacent regions 24. While diamond seeds are illustrated in this second nucleation model, those of skill in the art will readily appreciate that nondiamond carbon-containing material may also be used. As would be readily understood by those skilled in the art, for heavy seeding, the highly concentrated Ni—C—H regions 23 may extend across the entire substrate in a layer rather than in discrete areas as shown in the illustrated embodiment.

Although graphite formation is generally inhibited on such a Ni surface, the nucleation of oriented diamond 30 (FIG. 3C) is believed to occur only in those surface regions 23 where the carbon-to-nickel atomic ratio is above a certain value. This C/Ni ratio may be used to define the chemical composition of the correct surface states upon which diamond will nucleate. The orientations of diamond nuclei 30 are readily coincident with the substrate surface Ni lattice because of the close lattice parameter match of the two.

The first and second nucleation models regard the locally supersaturated sites with carbon and hydrogen in the Ni surface as diamond nucleation centers. Both carbon and hydrogen dissolve into the Ni lattice, but they remain highly concentrated. in the surface region. Because the graphite formation is inhibited on such a diamond seeded and carbon supersaturated Ni surface, the orientation of the diamond nuclei can be coincident with the surface Ni lattice which has a close lattice parameter match with diamond. In the first nucleation model, the Ni—C—H areas 23 are portrayed as bumps or protrusions on the substrate surface indicative of their retention of a partially crystalline structure, while in the second nucleation model the Ni—C—H is completely dissolved into the bulk Ni lattice.

Figure 4A:
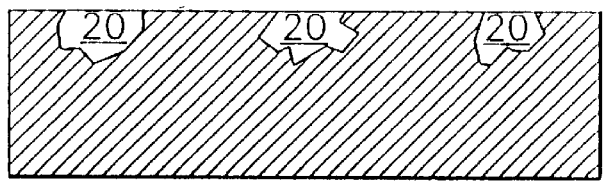
FIGS. 4A–4E are schematic cross-sectional views illustrating the method according to the present invention according to a partial dissolution and reorientation model starting with diamond particles.
Figure 4B:
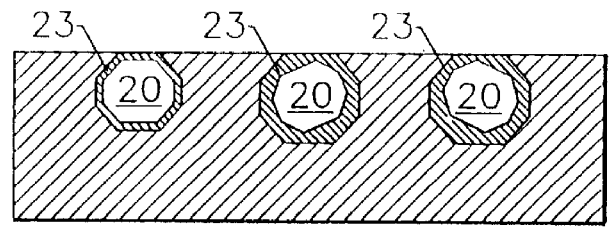
Figure 4C:
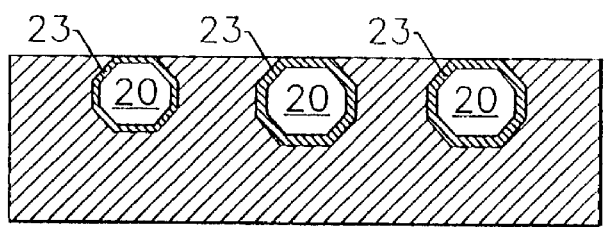
Figure 4D:
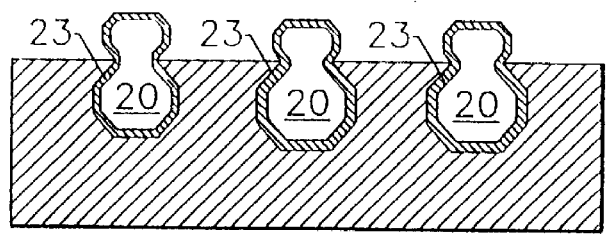
Figure 4E:
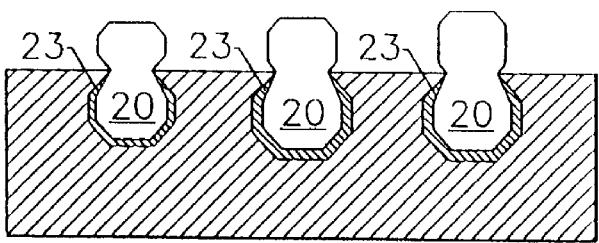

As shown in FIGS. 4A–4E, another proposed mechanism for formation of the oriented diamond is a partial dissolution and reorientation mechanism. The substrate 15 is first seeded with diamond powder (FIG. 4A). FIG. 4B illustrates partial dissolution of the diamond seeds 20 after annealing in hydrogen at about 1100° C. and formation of the intermediate Ni—C—H surface states 23. As shown in FIG. 4C, rotation of the diamond seeds 20 is believed to occur by lattice potential through the molten media 23. In FIG. 4D, diamond nucleation and growth causes the seeds 20 to grown through metallic surface layers, and FIG. 4E illustrates continuing growth of the diamond.

The partial dissolution and reorientation model considers that the diamond seeds 20 are only partially dissolved in the Ni lattice of the substrate 15 upon annealing and are surrounded by the molten Ni—C—H media 23. The remaining diamond seeds are believed to possess a regular shape bounded with low index planes such as {100} and {111} to assume a minimum surface energy. Similarly, the interface between the molten media and the solid Ni lattice is also likely composed of low index planes. Such a configuration will allow the partially dissolved diamond seeds to reorient themselves into alignment with the Ni lattice through a capillary force similar to the operating mechanism in "graphoepitaxy", as described, for example by V. I. Klykov and N. N. Sheftal, J. Cryst. Growth, 52 (1981) 687; and H. I. Smith, M. W. Geis, C. V. Thompson and H. A. Atwater, J. Cryst. Growth, 63 (1983) 527). Diamond will then grow from these reoriented diamond seeds, and a film composed of highly oriented diamond grains thus forms.

The major supportive evidence for the partial dissolution and reorientation mechanism includes the surprisingly similar growth morphology of the diamond films to those Si films grown by typical graphoepitaxy processes (V. I. Klykov, N. N. Sheftal and E. Hartmann, Acta Physica Academiae Scientiarum Hungaricae, 47 (1979) 167).

Figure 5A:
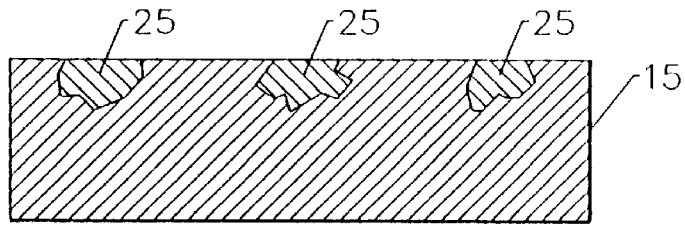
FIGS. 5A–5F are schematic cross-sectional views illustrating the method according to the present invention according to a partial dissolution and reorientation model starting with nondiamond carbon-containing particles.
Figure 5B:
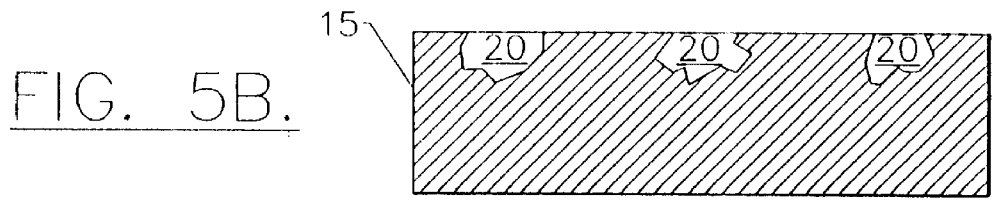
Figure 5C:
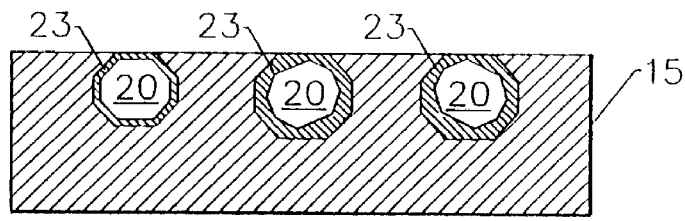
Figure 5D:
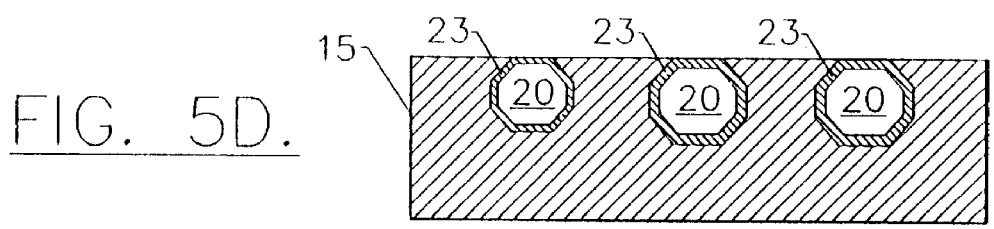
Figure 5E:
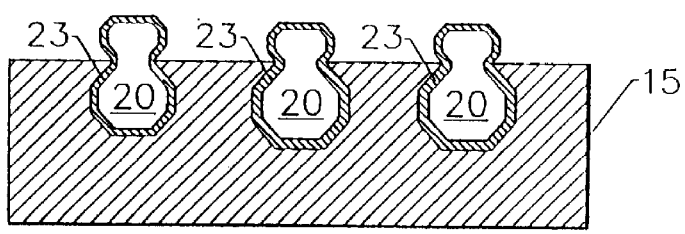
Figure 5F:
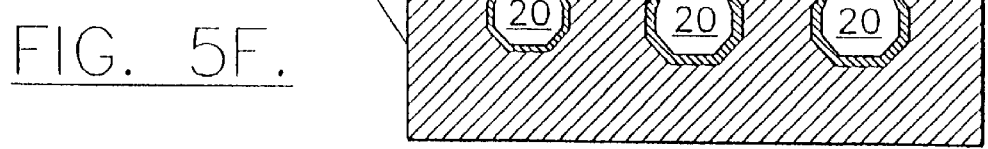

Referring to FIGS. 5A–5F, a partial dissolution and reorientation model is illustrated wherein the seed material is a nondiamond carbon powder rather than the diamond seeds as discussed above. Accordingly, as shown in FIGS. 5A and 5B, it is theorized without applicants wishing to be bound thereto that a transition from the nondiamond carbon powder to diamond first occurs in the presence of Ni and atomic hydrogen. The remaining steps of the proposed mechanism are as described above with respect to the diamond powder seeding.

The partial dissolution and reorientation mechanism emphasizes the role of molten eutectic phases in the development of orientation. It considers that the diamond seeds 20 are only partially dissolved. Upon annealing at the high temperature, the diamond seeds 20 react rapidly with the Ni lattice and form nickel-carbon (or nickel-carbide) eutectic phases, nickel hydrides and possibly Ni—C—H ternary phases 23. These phases have lower melting points (M.P.) than Ni (1450° C.). For example, the M.P. of the Ni—C eutectic is 1318° C. at atmospheric pressure (H. M. Strong, *Acta Metallurgica* 12, 1411 (1964)), and the M.P. of nickel hydride is 1150° C. (A. R. Badzian and T. Badzian, in *Chemical Vapor Deposition of Refractory Metals and Ceramics*, edited by T. M. Besmann, B. M. Gallois and J. Warren, Mat. Res. Soc. Symp. Proc. 250, Pittsburgh, Pa., 1992, p. 339). A ternary eutectic compound consisting of Ni, C and H could have an even lower M.P. Therefore, it is not surprising to observe melting during the high temperature heating or annealing. Under such circumstances, the partially dissolved diamond seeds 20 would be surrounded by the molten Ni—C—H media 23, and they could reorient themselves into alignment with the Ni lattice in the liquid media through a capillary force similar to the operating mechanism in "graphoepitaxy" (V. I. Klykov and N. N. Sheftal, *J. Cryst. Growth*, 52 (1981) 687–691; V. I. Klykov, N. N. Sheftal and E. Hartmann, *Acta Physica Academiae Scientiarum Hungaricae*, 47 (1979) 167–183; and H. I. Smith, M. W. Geis, C. V. Thompson and H. A. Atwater, *J. Cryst. Growth*, 63 (1983) 527–546).

It should be noted that each model or mechanism recognizes the importance of the Ni—C—H intermediate states formed by high temperature annealing in hydrogen atmosphere. In the partial dissolution and reorientation model, the ternary intermediate states act as a molten media to facilitate the reorientation of the partially dissolved diamond seeds, and in the first and second nucleation models, the ternary surface states are direct templates for the nucleation of epitaxial diamond. However, the precise nature of these surface states, that is, their composition and structure, are unknown. In addition, each mechanism encounters difficulties in explaining all of the experimental observations.

The partial dissolution and reorientation model is weak in that it can not account for the encouraging results associated with the use of nondiamond powders unless transformation of nondiamond powders into diamond structure is believed to occur on the Ni surface in the presence of atomic hydrogen (FIGS. 5A–5F). Although the direct nucleation models may seem more plausible, the major supportive evidence for the partial dissolution and reorientation mechanism includes the surprisingly similar growth morphology of the diamond films to those Si films grown by typical graphoepitaxy processes.

The method of the present invention is desirably used to produce a microelectronic structure including an oriented diamond film. The oriented diamond film may be used for forming diamond-based semiconductor devices, such as for high temperature or radiation-hard applications. Alternately, a layer of single crystal semiconducting diamond may be readily deposited onto the oriented diamond film for fabricating diamond semiconductor devices thereon.

The microelectronic structure includes a transition metal substrate capable of dissolving carbon, a surface region on the transition metal substrate including transition metal-carbon-hydrogen states, and the oriented diamond film on the surface region. In other words, the substrate has a surface region saturated with carbon and hydrogen. As discussed above, the transition metal is preferably selected from the group consisting of nickel, cobalt, chromium, magnesium, iron, and alloys thereof, and more preferably, selected from the group consisting of nickel, cobalt, and alloys thereof which have a relatively close lattice match to diamond. For a single crystal substrate, the oriented diamond film is preferably formed on a low index plane oriented face selected from the group consisting of $\{100\}$, $\{110\}$, $\{111\}$, $\{120\}$, $\{112\}$, $\{114\}$, and $\{221\}$.

The following Examples are included as illustrative of the present invention without being limiting thereof.

EXAMPLE 1

The deposition experiments were performed in a typical hot filament CVD reactor 10 as described above. Briefly, the process started with seeding single crystal Ni substrates 15 with diamond powders and then annealing the seeded substrates at a temperature of 1100° C. in a hydrogen atmosphere. The annealing time was controlled by the visual appearance of the seeded substrates which would change from dark-gray in the initial annealing stage to reflective or shiny when the desired surface stated was formed. After the annealing, the temperature was lowered to 900° C. for normal diamond nucleation and growth. The process conditions at this stage included a pressure of 20 torr, a total gas flow rate of 800 sccm, and a methane concentration of 0.5% in $H_2$.

Figure 6A:
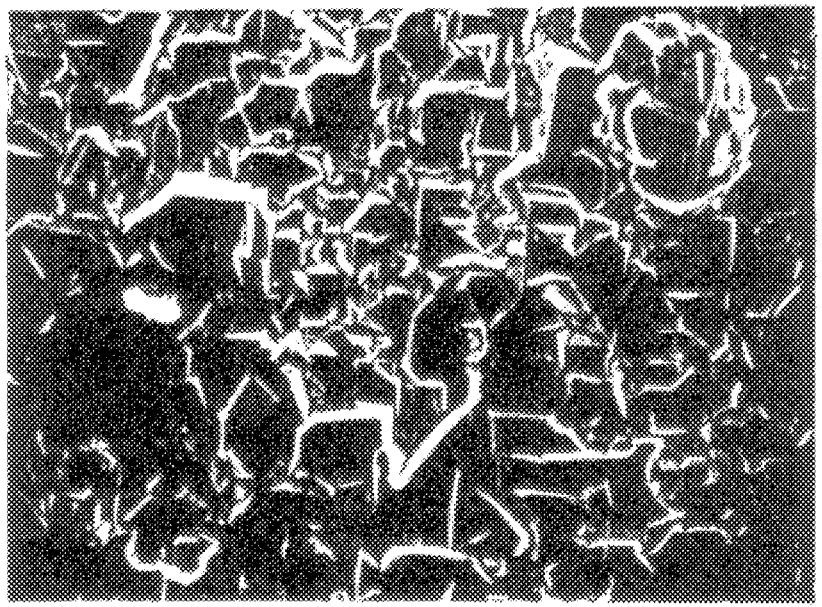
FIGS. 6A and 6B are SEM micrographs of diamond films grown on a <100> oriented single crystal Ni surface and a <111> oriented single crystal Ni surface, respectively, as described in Example 1.
Figure 6B:
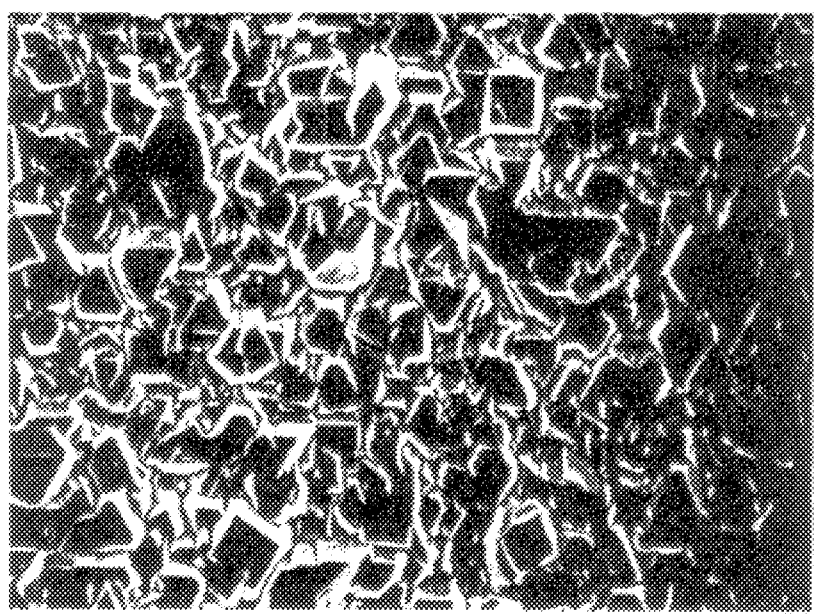

By this seeding, annealing and deposition process, well crystallized and highly oriented diamond nuclei were deposited on the Ni substrates as shown in FIGS. 6A and 6B. Simultaneously, the graphite formation was suppressed. There are a wealth of interesting experimental phenomena which occurred during the deposition process such as surface melting which is possibly associated with the formation of Ni—C—H eutectic phases and the existence of a molten metallic layer on the surface of diamond nuclei. These observations are similar to the findings in the solvent-catalyst high pressure/high temperature (HPHT) diamond crystallization process (see, for example, R. H. Wentorf, Jr., Adv. Chem. Phys. 9 (1965) 365; and H. M. Strong, Acta Metallurgica 12 (1964) 1411) and provide important clues to the elucidation of chemical mechanisms responsible for the nucleation and growth of oriented diamond films on Ni surfaces.

Experiments involving nondiamond carbon powders such as $C_{60}$, graphite and soot as seeds have also been conducted recently. In addition, in-situ deposited graphite layers on Ni surfaces at low temperatures have also been utilized. During the annealing, the Ni surface seeded with $C_{60}$ would turn from red-brown to gray and subsequently to shiny. The surface seeded with graphite and soot would turn from black to light-gray.

Severe etching of graphite and soot powders by atomic hydrogen occurred during the annealing which gasified these powders, thereby only allowing them to be partially dissolved into the Ni lattice. For this reason, annealing of graphite seeded in Ni substrates was mostly conducted in an argon atmosphere. The deposition results indicated that these nondiamond seeds were effective for promoting diamond nucleation, but the orientation of the resulting diamond nuclei compared unfavorably to those nucleated on diamond seeded and annealed substrates as shown in FIGS. 7A and 7B. Further optimization of the parameters of the multi-step HFCVD process may be required, particularly for those processes involving nondiamond seeds.

Figure 7C:
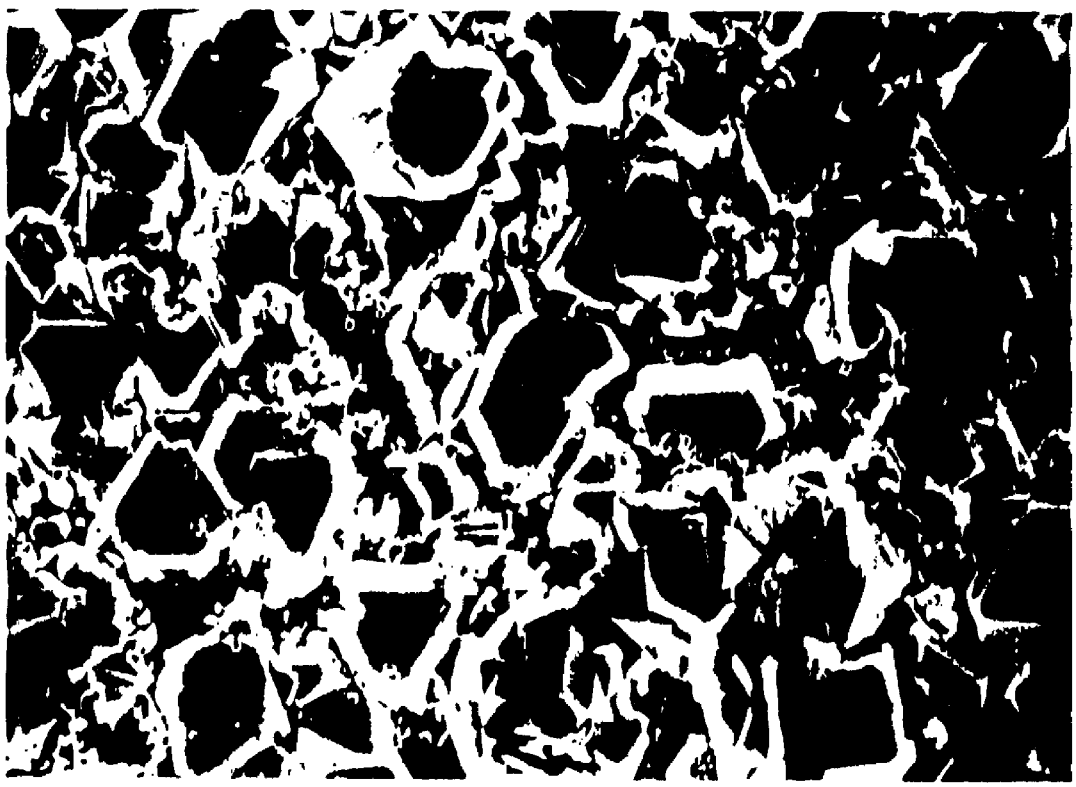
Figure 8A:
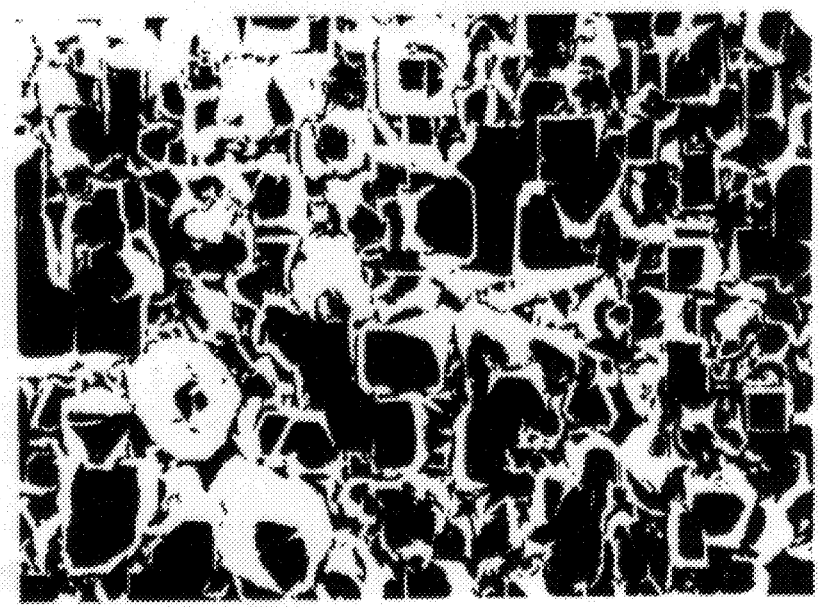
FIGS. 8A and 8B are SEM micrographs of diamond films grown on a <100> oriented single crystal Ni surfaces, as described in Example 2.
Figure 8B:
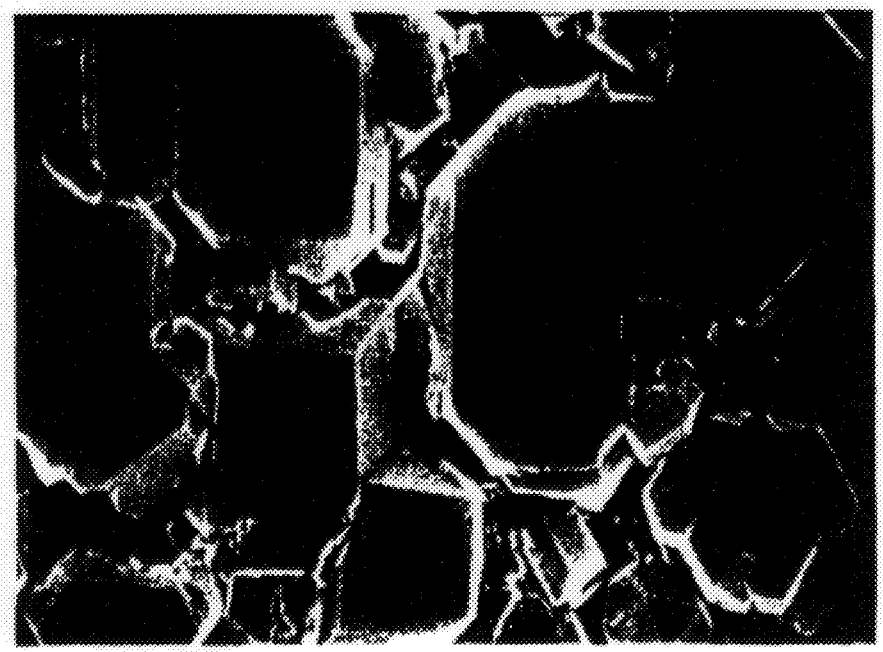
Figure 9A:
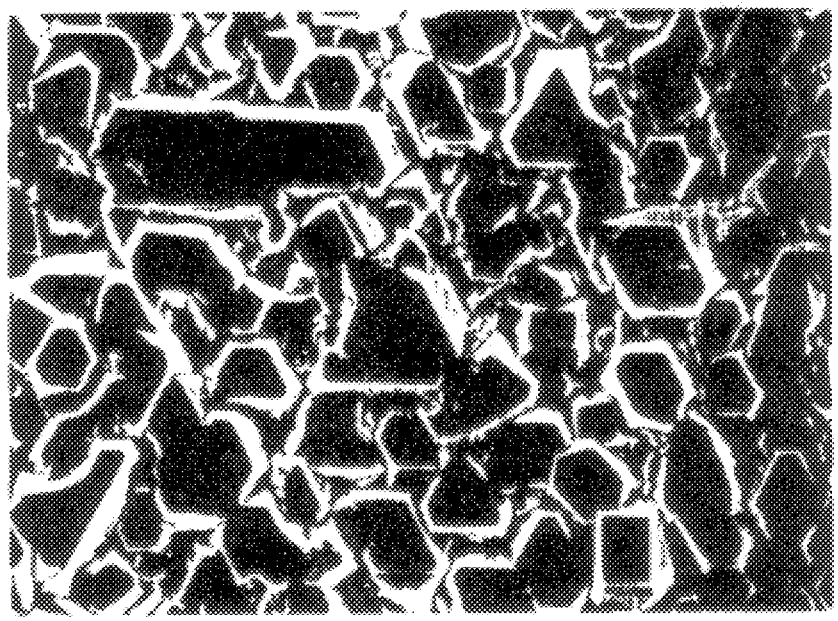
FIGS. 9A and 9B are SEM micrographs of diamond films grown on a <111> oriented single crystal Ni surfaces, as described in Example 2.
Figure 9B:
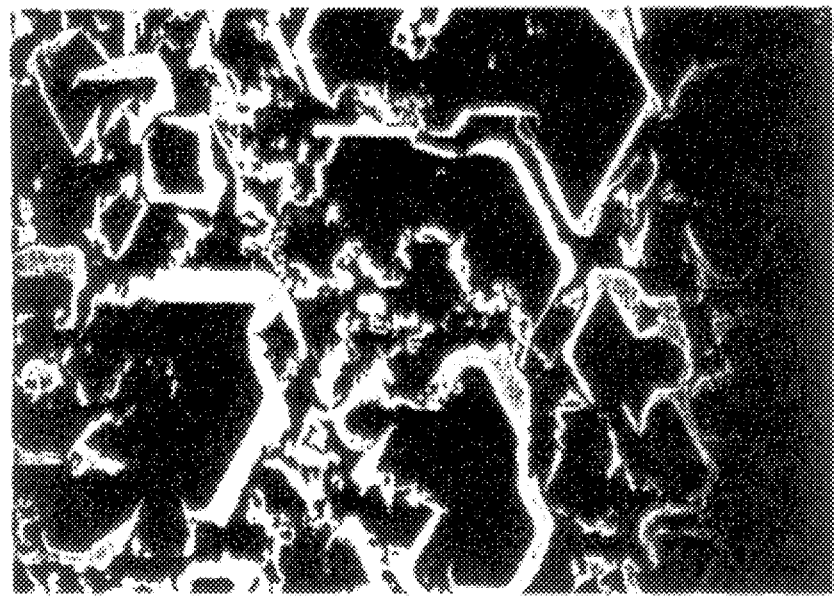

In addition, Ni substrates have been pretreated in-situ at 1100° C. in a hydrogen atmosphere with a high methane concentration (such as 5.0%). The purpose of such a treatment was to effectively saturate the Ni surface with gaseous carbon and form desirable Ni—C—H surface states upon which oriented diamond could nucleate. The subsequent deposition resulted in highly oriented diamond nuclei as shown in FIG. 7C. The degree of orientation for diamond nucleated on such in-situ pretreated Ni surfaces saturated with gaseous carbon at high temperatures is comparable with those nucleated on diamond seeded substrates.

It is interesting to note that the surface morphologies of diamond formed on the Ni surfaces appear similar regardless of the types of carbon seeds used. Evidence of melting and flow patterns is apparent on the surfaces of all samples. This suggests that there is a common mechanism involved which is responsible for the oriented nucleation of diamond on Ni substrates.

It appears clear from the deposition experiments that graphite formation can be easily suppressed on a Ni surface by forming either a nickel hydride or a nickel-carbon-hydrogen intermediate state through the annealing process. However, it is believed without applicants wishing to be bound thereto that effective diamond nucleation requires that the Ni surface be saturated with carbon, and the development of heteroepitaxial orientation requires that the annealing is conducted at a high enough temperature (about 1100° C.) in hydrogen atmosphere so that molten eutectic phases consisting of nickel, carbon and hydrogen can be formed.

The molten ternary (Ni—C—H) eutectic phases, similar to the Ni—C binary intermediate states proposed in the HPHT literature (R. H. Wentorf, Jr., Adv. Chem. Phys. 9 (1965) 365), are believed to be the key surface states required to effectively nucleate oriented diamond on Ni substrates. Further improvement of the deposition process requires a better understanding of the structure and composition of the ternary intermediate states. However, due to the problem of carbon precipitation during the temperature decrease, conventional techniques of characterizing samples at room temperature are limited in obtaining truly meaningful data. Techniques such as in-situ Raman spectroscopy may be highly desired.

EXAMPLE 2

These experiments employed heavy seeding by directly sprinkling a layer of diamond powders onto the surfaces of both <100> and <111> oriented single crystal Ni substrates 15. The seeded substrates were then placed in a hot filament CVD reactor 10 as described above and annealed at a temperature of about 1100° C. in a pure hydrogen atmosphere by radiative heating from the tungsten filament which was held at a temperature of approximately 2300° C.

The annealing time varied depending on the degree of seeding and the exact surface temperature. It is believed that the anneal must be held long enough to allow for sufficient reactions between the Ni, seeded carbon and hydrogen to form Ni—C—H intermediate states which suppress graphite formation and promote diamond nucleation. On the other hand, the seeded substrates must not be over-annealed because the diamond seeds will then completely dissolve and diffused into the bulk of the Ni lattice with no effective nucleation centers left on the surface.

In practice, the duration of the anneal was effectively controlled by the visual appearance of the seeded substrates which would change from dark-gray in the initial annealing stage to reflective or shiny when the desirable Ni—C—H surface states were formed. After annealing, the temperature was lowered to 900° C. for normal diamond nucleation and growth at a pressure of 20 Torr and a total gas flow rate of 800 sccm. The methane concentration in hydrogen was varied depending on the preferred orientation of the final film. For the <100> orientation, the methane concentration was set at 0.5% in $H_2$, and for the <111> orientation, the methane concentration was controlled at 0.3% in $H_2$.

As shown in FIGS. 8A to 9B, both <100> and <111> oriented films could be grown on single crystal Ni surfaces under the above experimental conditions. It can be seen that in many areas, individual nuclei were grown together with the grain boundaries being eliminated. This was extremely encouraging because it indicated that there was very little misorientation among the neighboring nuclei. As the percentage of such oriented nuclei is further increased and suitable growth condition are determined to foster the selective growth of the preferred orientations, complete single crystal films can be developed with essentially no grain boundaries present which is highly desirable for electronics devices applications. Currently, consistent orientations of about 85% of the diamond nuclei have been realized in an area of about 5×5 $mm^2$. It appears that melting still occurred during the process as evidenced from the morphological appearance of molten phases surrounding the nuclei. However, the amount of these molten phases (as evidenced by solidified droplets on the surface of the nuclei) was greatly reduced compared to the previous report. This is believed to be related to the lower annealing temperature (1100° C.) which was used here instead of a previously used higher temperature (1200° C.).

Figure 10:
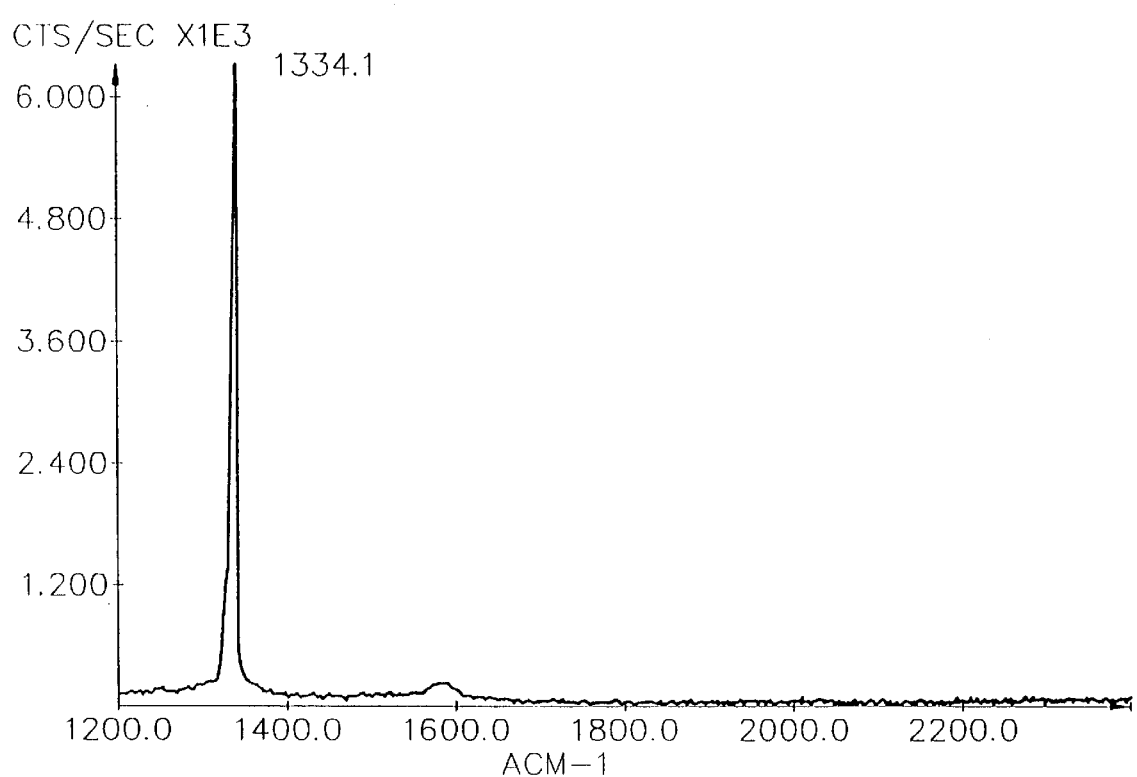
FIG. 10 is a Raman spectrum measured from the surface of a diamond film, as described in Example 2.

The Raman spectrum in FIG. 10 confirmed that the oriented diamond films. possessed high structural quality. However, contrary to previous measurements on samples which were relatively lightly seeded with diamond by scratching, there was apparently a graphitic signal detected from the open substrate areas not covered by the diamond films. However, the intensity of this graphitic peak was very small. It is believed that the graphite was not co-deposited at the high temperature during the process of nucleating and growing diamond, but was a result of carbon precipitation from the highly supersaturated Ni surface (due to heavy seeding) during the cooling stage. Otherwise, the presence of a graphitic layer between the Ni and diamond would prevent the development of diamond orientations obtained on different orientations of Ni as shown in FIGS. 8A–9B.

The formation of graphite upon carbon precipitation from the Ni lattice resulting from the decrease of temperature has been widely reported in the literature as described, for example by J. C. Shelton, H. R. Patil and J. M. Blakely, Surf. Sci. 43, 493–520 (1974); J. F. Mojica and L. L. Levenson, Surf. Sci. 82, 228–236 (1979); and M. Eizenberg and J. M. Blakely, Surf. Sci. 82, 228–236 (1979)). In-situ diagnostics such as Raman spectroscopy may be necessary to confirm this behavior in the CVD process.

The detailed chemical mechanisms responsible for the nucleation and growth of oriented diamond films are still not fully understood. However, it appears clear from the deposition experiments that graphite formation could be suppressed by forming either a nickel hydride or a nickel-carbon-hydrogen intermediate state through the annealing process. However, effective diamond nucleation required that the Ni surface was saturated with carbon. It has been postulated in the literature that the formation of Ni—C intermediate states in which carbon atoms are in a tetrahedral bonding configuration precedes the diamond crystallization from the Ni—C solvent media both under HPHT conditions (R. H. Wentorf, Jr., Adv. Chem. Phys. 9, 365 (1965)) and in an atmospheric recrystallization process (K. A. Cherian, Surf. Coat. Technol. 47, 127 (1991)).

It was believed that similar intermediate states consisting of nickel, carbon and hydrogen were formed in the CVD process which were responsible for the nucleation of diamond, not graphite, on the Ni surfaces. However, the exact nature of these intermediate states (structure and composition) is unknown at present. It was also found that the temperature window for the formation of the desirable intermediate states was very narrow, and deviations from the correct annealing and growth temperatures resulted in either graphite formation or no deposits at all.

In summary, the successful nucleation and growth of oriented diamond films on Ni substrates has been realized by the HFCVD process involving seeding, annealing and nucleation and growth. It was found that heavy seeding followed by annealing resulted in high densities of both <100> and <111> oriented diamond nuclei on single crystal Ni surfaces which could subsequently grow together with grain boundaries being eliminated. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A microelectronic structure comprising:
    a substrate comprising a transition metal capable of dissolving carbon;
    a surface region on the transition metal substrate comprising transition metal-carbon-hydrogen states; and
    an oriented diamond film on said surface region wherein individual diamond nuclei of said oriented diamond film are in alignment with a lattice of corresponding portions of said substrate.

2. A microelectronic structure according to claim 1 wherein said transition metal is selected from the group consisting of nickel, cobalt, chromium, magnesium, iron, and alloys thereof.

3. A microelectronic structure according to claim 1 wherein said transition metal substrate is single crystal comprising a transition metal selected from the group consisting of nickel, cobalt, and alloys thereof which have a relatively close lattice match to diamond.

4. A microelectronic structure according to claim 3 wherein said single crystal substrate has a low index plane oriented face selected from the group consisting of {100}, {110}, {111}, {120}, {112}, {114}, and {221}.

5. A microelectronic structure according to claim 1 wherein said transition metal substrate is polycrystalline.

6. A microelectronic structure comprising:
    a nondiamond substrate comprising a transition metal capable of dissolving carbon, said substrate having a surface region saturated with carbon and hydrogen; and
    an oriented diamond film on the surface region of the substrate wherein individual diamond nuclei of said oriented diamond film are in alignment with a lattice of corresponding portions of said nondiamond substrate.

7. A microelectronic structure according to claim 6 wherein said transition metal is selected from the group consisting of nickel, cobalt, chromium, magnesium,. iron, and alloys thereof.

8. A microelectronic structure according to claim 6 wherein said transition metal substrate is single crystal comprising a transition metal selected from the group consisting of nickel, cobalt, and alloys thereof which have a relatively close lattice match to diamond.

9. A microelectronic structure according to claim 8 wherein said single crystal substrate has a low index plane oriented face selected from the group consisting of {100}, {110}, {111}, {120}, {112}, {114}, and {221}.

10. A microelectronic structure according to claim 6 wherein said transition metal substrate is polycrystalline.

* * * * *

UNITED STATES PATENT AND TRADEMARK OFFICE
CERTIFICATE OF CORRECTION

PATENT NO. : 5,849,413
DATED : December 15, 1998
INVENTOR(S) : Zhu, et al.

It is certified that error appears in the above-identified patent and that said Letters Patent is hereby corrected as shown below:

On the title page, item [62]:

Under Related U.S. Application Data: Insert --abandoned,--following Ser. No. 062,473, May 17, 1993

Column 1, line 8:

Insert--, now abandoned, -- following " Ser. No. 062,473, May 17, 1993".

Signed and Sealed this

Twenty-ninth Day of June, 1999

Attest:

Q. TODD DICKINSON

*Attesting Officer*    *Acting Commissioner of Patents and Trademarks*